United States Patent [19]

Karim

[11] Patent Number: 4,589,112

[45] Date of Patent: May 13, 1986

[54] SYSTEM FOR MULTIPLE ERROR DETECTION WITH SINGLE AND DOUBLE BIT ERROR CORRECTION

[75] Inventor: Faraydon O. Karim, Vestal, N.Y.

[73] Assignee: International Business Machines Corporation, Armonk, N.Y.

[21] Appl. No.: 574,221

[22] Filed: Jan. 26, 1984

[51] Int. Cl.[4] .............................................. G06F 11/10
[52] U.S. Cl. .......................................... 371/37; 371/39
[58] Field of Search .............................. 371/37, 39, 40

[56] References Cited

U.S. PATENT DOCUMENTS

| | | | |
|---|---|---|---|
| 3,622,982 | 11/1971 | Clark, Jr. et al. | 371/37 |
| 3,685,014 | 8/1972 | Hsiao et al. | 371/37 |
| 3,714,629 | 1/1973 | Hong et al. | 371/37 X |
| 4,030,067 | 6/1977 | Howell et al. | 371/37 |
| 4,117,458 | 9/1978 | Burghard et al. | 371/37 |

Primary Examiner—Charles E. Atkinson

Attorney, Agent, or Firm—Mark Levy

[57] ABSTRACT

A system for detecting multiple errors that may occur during transfer of data and for correcting up to two of these errors simultaneously. The system has a component for calculating a number of check bits associated with the data word. Also provided is a component for grouping all data bits into base groups and multiple groups, the sum of the number of base groups and multiple groups being equal to the number of check bits. Up to two weights are assigned for each data bit. The system distributes the data bits among the groups according to the weights assigned thereto. Also provided is a component for generating a check bit for each of the groups and for padding the data word with the check bits to form an appended data word. A generator creates a predetermined number of syndrome bits, the number being the number of check bits. Finally, a decoder is provided for decoding the syndrome bits to identify the erroneous bits in the data word.

5 Claims, 3 Drawing Figures

SYSTEM FOR MULTIPLE ERROR DETECTION WITH SINGLE AND DOUBLE BIT ERROR CORRECTION

BACKGROUND OF THE INVENTION

1. Field of the Invention

The present invention relates to a system for detecting and correcting errors in data transfer and, more particularly, to a system for detecting single or multiple bit errors and for correcting single or double bit errors.

2. Description of the Prior Art

In any digital system where data is transmitted, one or more of the data bits in each data word or message may be received in error. This has been a problem from the time data processing systems were first invented.

As more sophisticated data processing operations are performed, involving more complex equipment, there is a greater need for systems to detect and correct multiple errors in data transfers. For example, operations such as merging of files, sorting of data within files, numerical/statistical analyses, complex data handling procedures and word processing operations require increased reliability in data transfer. In the field of telecommunications and telemetry, error rates tend to increase when data is transmitted over analog lines at high baud rates. If data errors occur and are undetected, valuable information and system operation itself may be affected. Thus, error detecting and correcting features are not only advantageous, they are required to improve system integrity.

In response to the problem of error generation during data transfers, systems have been developed to detect such errors. One of the earliest methods for detecting errors was the parity check code. A binary code word has odd parity if an odd number of its digits are 1's. For example, the number 1011 has three 1 digits and therefore has odd parity. Similarly, the binary code word 1100 has an even number of 1 digits and therefore has even parity.

A single parity check code is characterized by an additional check bit that is added to each word to generate either odd or even parity. An error in a single digit or bit in a data word would be discernible since the parity check bit associated with that data word would then be reversed from what is expected. Typically, a parity generator adds the parity check bit to each word before transmission. This technique is called padding the data word. At the receiver, the digits in the word are tested and if the parity is incorrect, one of the bits in the data word is considered to be in error. When an error is detected at a receiver, a request for a repeat transmission can be given so that the error can be corrected. It should be noted that only errors in an odd number of digits can be detected with a single parity check, since an even number of errors results in the parity expected for a correct transmission. Moreover, it should be noted that the specific bit in error cannot be identified by the parity check procedure as hereinabove described.

A more sophisticated error detection system was later devised. Data words of a fixed length of bits were grouped into blocks of a fixed number of data words each. Parity checks were then performed between different data words as well as for each individual data word. The block parity code detected many patterns of errors and could be used not only for error detection, but also for error correction when an isolated error occurred in a given row and column of the matrix. While these geometric codes were an improvement over parity check bits per se, they still could not be used to detect errors that were even in number and symmetrical in two dimensions.

After parity check codes and geometric codes were devised, a code was invented by Hamming, after whom it is named. The Hamming code is a system of multiple parity checks that encodes data words in a logical manner so that single errors can be not only detected but also identified for correction. A transmitted data word used in the Hamming code consists of the original data word and parity check digits appended thereto. Each of the required parity checks is performed upon specific bit positions of the transmitted word. The system enables the isolation of an erroneous digit, whether it is in one of the original data word bits or in one of the added parity check bits.

If all the parity check operations are performed successfully, the data word is assumed to be error free. If one or more of the check operations is unsuccessful, however, the single bit in error is uniquely determined by decoding so-called syndrome bits, which are derived from the parity check bits. It should be noted once again that only single bit errors are detected and corrected by use of the conventional Hamming code. Double bit errors, although detectable by the Hamming code, are not correctable.

The Hamming code is only one of a number of codes, generically called error correcting codes (ECC's). Codes are usually described in mathematics as closed sets of values that comprise all the allowed number sequences in the code. In data communications, transmitted numbers are essentially random data patterns which are not related to any predetermined code set. The sequence of data, then, is forced into compliance with the code set by adding to it at the transmitter, as hereinabove mentioned. A scheme has heretofore been developed to determine what precise extra string to append to the original data stream to make the concatenation of transmitted data a valid code. There is a consistent way of extracting the original data from the code value at the receiver and to deliver the actual data to the location where it is ultimately used. For the code scheme to be effective, it must contain allowed values sufficiently different from one another so that expected errors do not alter an allowed value such that it becomes a different allowed value of the code.

A cyclic redundancy code (CRC) consists of strings of binary data evenly divisible by a generator polynomial, which is a selected number that results in a code set of values different enough from one another to achieve a low probability of an undetected error. To determine what to append to the string of original data, the original string is divided as it is being transmitted. When the last data bit is passed, the remainder from the division is the required string that is added since the string including the remainder is evenly divisible by the generator polynomial. Because the generator polynomial is of a known length, the remainder added to the original string is also of fixed length.

At the receiver, the incoming string is divided by the generator polynomial. If the incoming string does not divide evenly, an error is assumed to have occurred. If the incoming string is divided by the generator polynomial evenly, the data delivered to the ultimate destination is the incoming data with the fixed length remainder field removed.

A longitudinal redundancy code (LRC) is a special case of CRC where the particular generator polynomial chosen results in the same CRC code as would be obtained by performing an EXCLUSIVE OR operation once for every bit in the data word. If the data stream were represented as a succession of multi-bit words, for example, the LRC code added to the end of the stream would equal the first word EXCLUSIVE ORed with the second, EXCLUSIVE ORed with the third, and so on. When the check is made at the receiver, the result is zero if no errors occurred. This is simply because the EXCLUSIVE OR of any value with itself is zero. A multiple memory error correction technique is shown in J. Datres, et al, "Multiple Memory Error Correction", IBM Technical Disclosure Bulletin, Vol. 24, No. 6, November 1981. This system first detects an error and then stores the erroneous double word back in memory in its complemented form. The double word is then fetched from memory again. The newly fetched double word is then complemented and the ECC check syndrome is examined. Finally, the recomplemented data is then stored back into memory.

U.S. Pat. No. 4,163,147, issued to Scheuneman, et al also discloses a double bit error correction system using double bit complementing.

Both of the references hereinabove cited have disadvantages. One disadvantage is that memory time, normally slower than CPU time, is required for these complementing and storage/restorage operations. Another disadvantage for both of the above-mentioned systems is that the error correction technique is reliable only when two errors occur, one being a so-called hard error, induced by media defects, mechanical nonlinearities and the like, and the other being a soft error, induced by random noise, correlated noise and the like. That is, these systems are reliable if, and only if, one of the two bits is erroneous due to memory failure. If both data bits detected are in error due to hard causes or if both errors are due to soft causes, these detection/correction systems fail. Other errors not related to memory devices can occur during the transfer of data over electrical lines. Thus, another disadvantage of the above-mentioned references is that during the course of transferring data and the complemented form of the data back and forth to memory, more errors may be generated.

U.S. Pat. No. 4,397,022, issued to Weng, et al discloses a weighted erasure codec for a Golay code. This system uses a pair of read only memories (ROM's) which are used to store the most likely 12-bit error patterns corresponding to each syndrome. This system is inherently expensive due to the very large number of patterns that may occur, requiring correspondingly great memory capacity for look-up tables.

U.S. Pat. No. 4,330,860, issued to Wada, et al discloses an error correction scheme requiring two types of check codes, P and Q. These two check codes result in the accumulation of a great number of check bits that must be stored and processed in the course of data operations. The large number of error correction check bits, requiring relatively large memory size, forces the system with which it is used to become more costly as larger data words are handled.

It would be advantageous for a system not only to detect single and multiple errors during data transfer, but also to correct single and double bit errors.

It would also be advantageous for an error correcting system to minimize the amount of time required for memory operations.

It would also be advantageous to detect and correct one or two errors in a data message that may have occurred due to hardware malfunction alone, extraneous causes other than hardware malfunction, or a combination of both hard and soft causes.

It would also be advantageous to minimize data transfer operations during error detection and/or correction in order to reduce the probability of extraneous data errors occurring.

It would also be advantageous to minimize the number and size of error patterns required as look-up tables during the course of error detection/correction operations, thus reducing memory capacity required therefor.

Finally, it would be advantageous to use an error correction system requiring a minimum number of check bits in order to reduce memory capacity, processing time and probability of further error during data manipulation.

SUMMARY OF THE INVENTION

In accordance with the present invention, there is provided a system for detecting multiple errors that may occur during transfer of data and for correcting up to two of these errors simultaneously. The system has a component for calculating a number of check bits associated with the data word. Also provided is a component for grouping all data bits into base groups and multiple groups, the sum of the number of base groups and multiple groups being equal to the number of check bits. Up to two weights are assigned for each data bit. The system distributes the data bits among the groups according to the weights assigned thereto. Also provided is a component for generating a check bit for each of the groups and for padding the data word with check bits to form an appended data word. A generator creates a predetermined number of syndrome bits, the number being the number of check bits. Finally, a decoder is provided for decoding the syndrome bits to identify the erroneous bits in the data word.

BRIEF DESCRIPTION OF THE DRAWINGS

A complete understanding of the present invention may be obtained by reference to the accompanying drawings, when taken in conjunction with the detailed description thereof and in which.

DETAILED DESCRIPTION OF THE PREFERRED EMBODIMENT

It should be understood that any readily available programmable computer, properly programmed, may form the structure on which the present invention can operate. The nature of this invention, however, allows any one of a plurality of computers produced by any one of a number of manufacturers to be used with this invention.

Figure 1:
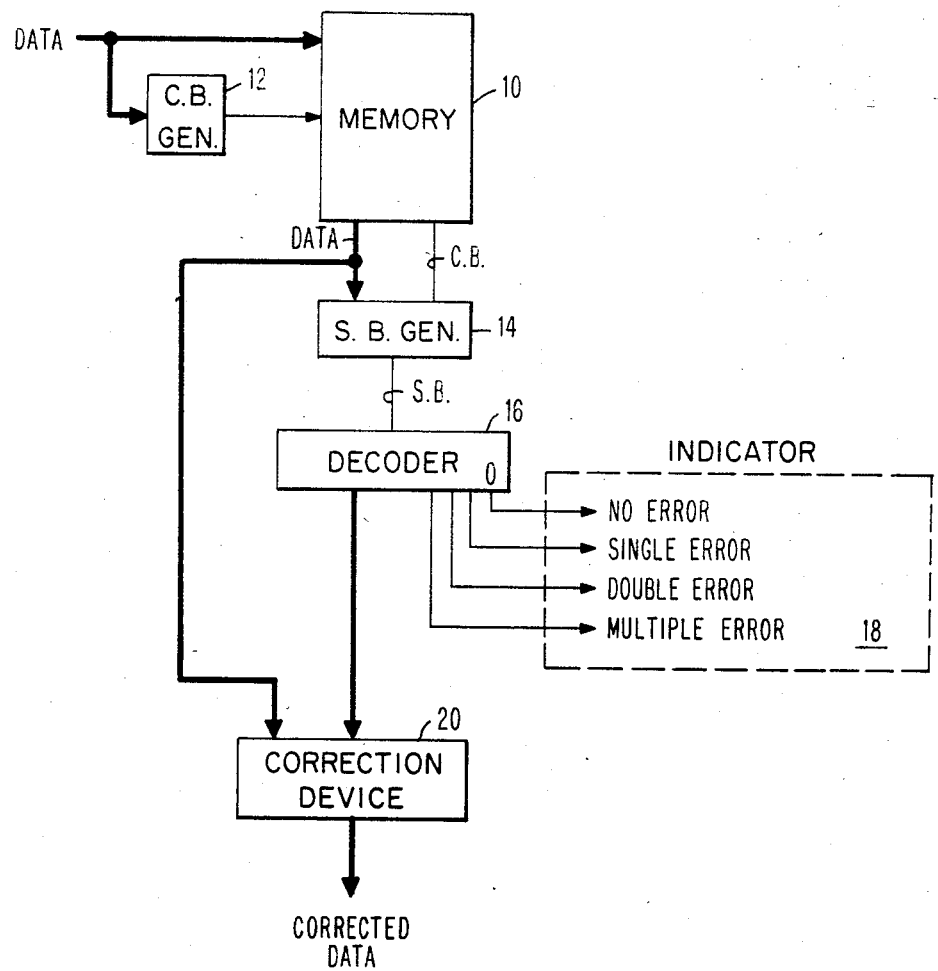
FIG. 1 is a schematic diagram of the system in accordance with the present invention.

Referring now to FIG. 1, there is shown a system memory device 10, which receives and stores a data stream consisting of separate data words or messages.

Each data word has a number of individual data bits, depending on the data processing system with which the present invention is intended to operate. Each bit is set to a value of 0 or 1. The data stream signal is also fed into a check bit generator 12 that generates a number of check bits which can be predetermined, as hereinbelow described, depending upon the length of the data words. These check bits are transferred from the check bit generator 12 to memory 10.

Once the data words and the check bits are stored in memory 10, they are accessed and retrieved from memory 10 by a syndrome bit generator 14. The same data stream signal transferred from memory 10 to the syndrome bit generator 14 is also applied to a correction device hereinafter described.

Connected to the syndrome bit generator 14 is a decoder 16. The decoder 16 receives syndrome bits from the syndrome bit generator 14 and decodes this information, generating a signal that represents a particular type of error. The signal generated by the decoder 16 indicates which of the bits in the data word are in error. The decoder 16 is adapted to provide a signal to identify whether an error occurred, whether the error was a single bit error, a double bit error or a multiple bit error. This signal is applied to a suitable indicator 18, such as a display, indicator LED's, a printout device or the like.

Once the decoder 16 has identified the errors, if any, it sends a signal to a correction device 20. The correction device 20 also accepts data words directly from memory 10. Thus, the correction device 20 receives both the data word and the syndrome bits which have been decoded by the decoder 16. The single bit or double bit errors are corrected, as appropriate.

Figure 2:
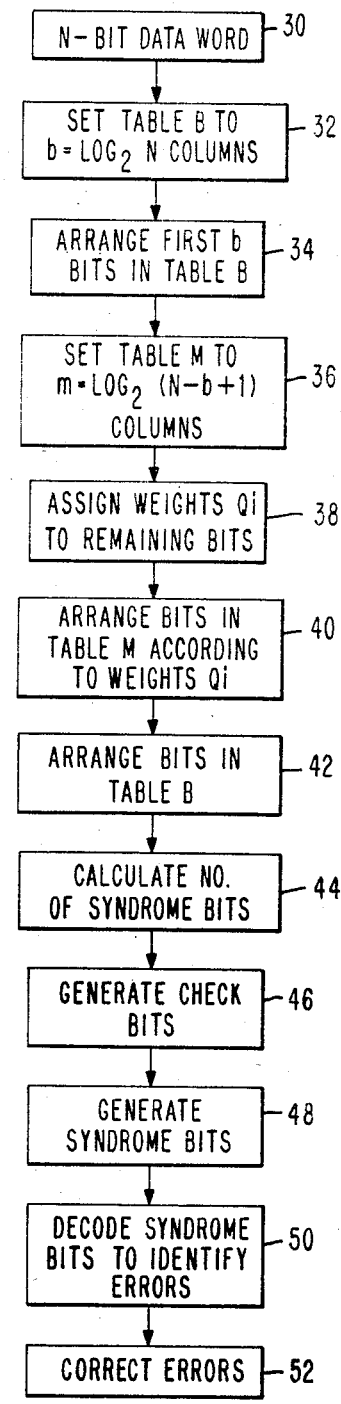
FIG. 2 is a flow chart representing a preferred method of detecting and correcting multi-bit errors for use in the instant system.

Referring now also to FIG. 2, there is shown a flow chart of the operations that occur during a data transfer operation. The first data word consists of N bits, block 30. The minimum number of check bits required to detect and identify any single bit error or double bit error in an N-bit data word must be capable of representing the following number of possibilities:

$$N + \frac{N!}{2!(N-2)!}$$

A base table, Table B, is generated, block 32. The number of columns in Table B is equal to:

$$b = |Log_2 N|$$

The symbols are used in equations herein to denote a quantity raised to the next highest integer.

For example, for a data word of 15 bits ($D_{15}$ _ _ _ _ $D_2 D_1$), the number of columns in Table B is calculated as follows:

$$b = |Log_2 15| = |3.906| = 4$$

That is, a 15-bit data word requires four columns in Table B.

The first b bits of the data word are arranged in sequence in Table B according to the distribution shown below, block 34:

TABLE B

| $B_b$ | ... | $B_4$ | $B_3$ | $B_2$ | $B_1$ |
|---|---|---|---|---|---|
| $D_b$ | ... | $D_4$ | $D_3$ | $D_2$ | $D_1$ | where D represents a data bit and the subscript indicates the ordinal number thereof. Each column of bits is called a base group.

The bits of the data word that remain after the base bits b are subtracted are called multiple layer bits. These multiple layer bits are distributed among base groups and multiple layer groups as hereinbelow described.

A multiple layer table, Table M is generated, block 36, having a number of columns which is calculated by the equation:

$$m = |Log_2(N-b+1)|$$

For a 15-bit data word, for example, the number of columns m is:

$$m = |Log_2(15-4+1)| = |Log_2 12| = |3.584| = 4$$

A check bit is generated from each group of bits. Thus, the length of the code (i.e., the total number of check bits required for a data word) is the sum of the base bits b and the multiple layer bits m. For a 15-bit data word, the total number of check bits is therefore:

$$b+m$$

$$4+4=8$$

Weights $Q_i$, each consisting of m bits, are assigned to the multiple layer bits, block 38. These bits are arranged in Table M according to the weights $Q_i$ assigned thereto, block 40.

TABLE M

| Data Bits | $Q_i$ |
|---|---|
| $D_{b+1}$ | 0001 |
| $D_{b+2}$ | 0010 |
| $D_{b+3}$ | 0011 |
| $D_{b+4}$ | 0100 |
| $D_{b+5}$ | 0101 |
| $D_{b+6}$ | 0110 |
| . | . |
| . | . |
| . | . |

The weights $Q_i$ have sequential binary values from 0 through (N−b), one weight for each multiple layer bit.

The distribution of the multiple layer bits on the base groups is accomplished by arranging these multiple layer bits with their weights $Q_i$ according to the following distribution, block 40.

```
0 _ _ _ 01 = D_{b+1}    (D_{b+2}D_{b+3})   (_ _ _)   (_ _ _)
0 _ _ _ 10 = D_{b+2}    (D_{b+1}D_{b+3})   (_ _ _)   (_ _ _)
0 _ _ _ 11 = D_{b+3}    (D_{b+1}D_{b+2})   (_ _ _)   (_ _ _)
  .                       .                 .         .
  .                       .                 .         .
_ _ _ _ _ _ = D_N       (_ _ _ _)          (_ _ _)   (_ _ _)
```

Multiple layer bit distribution Table M shown hereinabove is generated by EXCLUSIVE ORing each bit $D_b$ with each other bit $D_{b+1}, D_{b+2}, \ldots, D_N$ sequentially starting from the first entry in the table. Each EXCLUSIVE ORed pair is then placed in the row corresponding to the assigned weight with the same value, if it exists.

For example, bit $D_{b+1}$, whose binary value is 0 _ _ _ 01, EXCLUSIVE ORed with bit $D_{b+2}$, whose binary value is 0 _ _ _ 10, results in:

$$0 \_\_\_\_ 01 \oplus 0 \_\_\_\_ 10 = 0 \_\_\_\_ 11$$

Note that the value of this EXCLUSIVE OR operation is equal to the weight assigned to $D_{b+3}$. Thus, the pair $D_{b+1} D_{b+2}$ is placed in the first column of row $D_{b+3}$.

This procedure continues until all pairs of bits are EXCLUSIVE ORed with one another and the results indicate their appropriate placement in Table M.

This distribution can be further explained in greater detail with reference to FIG. 3, which is a flow chart of the method by which the base group table, Table B, is generated.

As hereinabove described, the multiple layer bits are arranged in Table B with their corresponding weights, block 60. A counter K is initialized to 0, block 62. The counter K is then incremented, block 64.

A new weight $W_i$ is then assigned to each multiple layer bit, block 66. Each new weight $W_i$ has b digits. The weight $W_i$ may be any binary number from $0 \_\_\_\_ 00$ to $1 \_\_\_\_ 11$ and is empirically and iteratively derived as herein described. The only restriction on new weights $W_i$ is that, for a given $D_i$th row in multiple layer bit distribution Table M shown hereinabove (the new weight having the form $W_0 W_1 \_\_\_ W_b$), none of the pairs of bits placed in the $D_i$th row, when EXCLUSIVE ORed with their new weights $W_i$, can equal each other. Similarly, the result of the EXCLUSIVE OR operation cannot equal the new weight $W_i$ with any one bit inverted. That is, the result of the EXCLUSIVE OR operation may not equal $W_0 W_1 \_\_\_ W_b$ or $W_0 W_1 \_\_\_ W_b$, and so on to $W_0 W_1 \_\_\_ W_b$.

Figure 3:
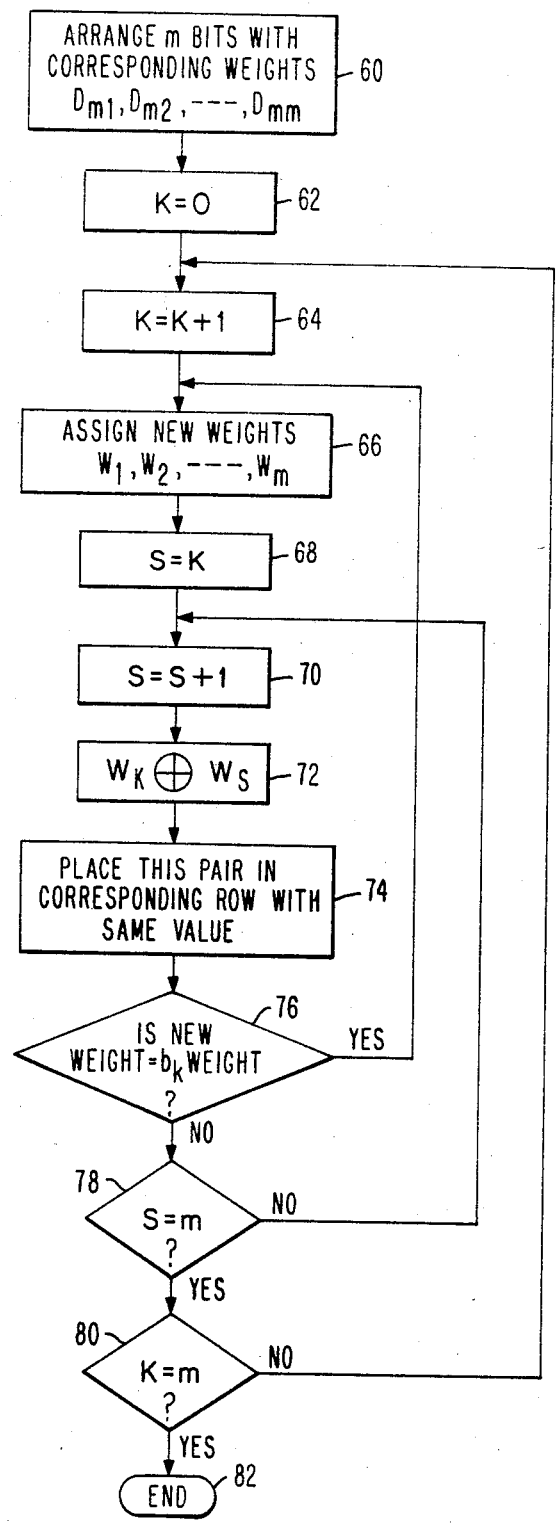
FIG. 3 is a flow chart representing a method of generating a base group table.

The above-mentioned new weight generation can also be described in flow chart form with reference to FIG. 3.

Another variable S is set equal to the value of K, block 68. The variable S is then incremented, block 70. The Kth weight is then EXCLUSIVE ORed with the Sth weight, block 72. The data bit and newly assigned weight pair is then placed in the corresponding row with the same value in Table B, block 74. The system then tests for whether the result of EXCLUSIVE ORing the new weight of the pair is equal to the weight of variable $b_K$; or whether the result of EXCLUSIVE ORing any other pair's weight is equal to the weight of $b_K$, block 76. If the new pair's EXCLUSIVE ORed weight or any other pair's EXCLUSIVE ORed weight is equal to the $b_K$ weight, yet another set of new weights is then assigned and tested empirically, block 66.

If, however, the new EXCLUSIVE ORed weight or any other EXCLUSIVE ORed weight does not equal the $b_K$ weight, the system then tests whether all data bits have been processed on the current row (for the current value of K), block 78. If all data bits have not yet been processed, the variable S is again incremented, block 70, and processing continues from that point.

If, however, all data bits have been processed for the current value of K, the system then tests whether all data bits have been processed for all values of K (i.e., all of the rows), block 80. That is, have all data bits in the matrix been processed?

If certain data bits have not yet been processed, the system returns to block 64, incrementing the value of variable K and continuing processing. If, however, all data bits have been processed, the system terminates processing, block 82, indicating that all of the new weights are valid.

It should be noted, in the ongoing example of a 15-bit data word, that the number of multiple layer bits is equal to:

$$N - b$$

$$15 - 4 = 11$$

In this example, each of the 11 bits is assigned the following bit locations.

TABLE M $D_5 = 0001$
$D_6 = 0010$
$D_7 = 0011$
$D_8 = 0100$
$D_9 = 0101$
$D_{10} = 0110$
$D_{11} = 0111$
$D_{12} = 1000$
$D_{13} = 1001$
$D_{14} = 1010$
$D_{15} = 1011$

Weights are assigned to the multiple layer bits to be distributed on the multiple layer groups according to the following arrangement.

| Multiple Layer Groups | | | | Base Groups | | | |
|---|---|---|---|---|---|---|---|
| $M_4$ | $M_3$ | $M_2$ | $M_1$ | $B_4$ | $B_3$ | $B_2$ | $B_1$ |
| $D_{12}$ | $D_8$ | $D_6$ | $D_5$ | $D_4$ | $D_3$ | $D_2$ | $D_1$ |
| $D_{13}$ | $D_9$ | $D_7$ | $D_7$ | | | | |
| $D_{14}$ | $D_{10}$ | $D_{10}$ | $D_9$ | | | | |
| $D_{15}$ | $D_{11}$ | $D_{11}$ | $D_{11}$ | | | | |
| | | $D_{14}$ | $D_{13}$ | | | | |
| | | $D_{15}$ | $D_{15}$ | | | | |

The multiple layer bits are then distributed onto the base groups as shown below.

TABLE 1

| 0001 | $D_5$ | $(D_6 D_7)$ | $(D_8 D_5)$ | $(D_{10} D_{11})$ | $(D_{12} D_{13})$ | $(D_{14} D_{15})$ |
|---|---|---|---|---|---|---|
| 0010 | $D_6$ | $(D_5 D_7)$ | $(D_8 D_{10})$ | $(D_9 D_{11})$ | $(D_{12} D_{14})$ | $(D_{13} D_{15})$ |
| 0011 | $D_7$ | $(D_5 D_6)$ | $(D_8 D_{11})$ | $(D_9 D_{10})$ | $(D_{12} D_{15})$ | $(D_{13} D_{14})$ |
| 0100 | $D_8$ | $(D_5 D_9)$ | $(D_6 D_{10})$ | $(D_7 D_{11})$ | | |
| 0101 | $D_9$ | $(D_5 D_8)$ | $(D_6 D_{11})$ | $(D_7 D_{10})$ | | |
| 0110 | $D_{10}$ | $(D_5 D_{11})$ | $(D_6 D_8)$ | $(D_7 D_9)$ | | |
| 0111 | $D_{11}$ | $(D_5 D_{10})$ | $(D_6 D_9)$ | $(D_7 D_8)$ | | |
| 1000 | $D_{12}$ | $(D_5 D_{13})$ | $(D_6 D_{14})$ | $(D_7 D_{15})$ | | |
| 1001 | $D_{13}$ | $(D_5 D_{12})$ | $(D_6 D_{15})$ | $(D_7 D_{14})$ | | |
| 1010 | $D_{14}$ | $(D_5 D_{15})$ | $(D_6 D_{12})$ | $(D_7 D_{13})$ | | |
| 1011 | $D_{15}$ | $(D_5 D_{14})$ | $(D_6 D_{13})$ | $(D_7 D_{17})$ | | |

New weights are assigned to the bits $D_5$ through $D_{15}$ as shown below.

| Bit | New Weight |
|---|---|
| $D_5$ | 0000 |
| $D_6$ | 1000 |
| $D_7$ | 1110 |
| $D_8$ | 0011 |
| $D_9$ | 1100 |
| $D_{10}$ | 0001 |
| $D_{11}$ | 1000 |
| $D_{12}$ | 0110 |
| $D_{13}$ | 0101 |
| $D_{14}$ | 0001 |
| $D_{15}$ | 0110 |

These new weights are then checked for validity by EXCLUSIVE ORing each of the bits with its pair, as follows.

$$D_5 \oplus D_8 = 0000 \oplus 0011 = 0011$$

$$D_6 \oplus D_{11} = 1000 \oplus 1000 = 0000$$

$$D_7 \oplus D_{10} = 1110 \oplus 0001 = 1111$$

Note that none of the EXCLUSIVE ORed results equal one another in the same row. Nor does any EXCLUSIVE OR result equal the multilayer bit in the same row. None of the pairs for $D_9$ in the Table equals the $D_9$ original weight (0101) or the $D_9$ original weight with any one bit inverted (i.e., 0100, 0111, 0001 or 1101). In the same way, all of the rows in Table 1 can be verified.

Referring now again to FIG. 2, once the validity of the new weights is proven for all bits in all rows, the bits are distributed on base groups according to their new weights in the same manner as was performed on multiple layer groups, block 42.

In the ongoing 15-bit data word example, the above-mentioned distribution appears as follows:

| $M_4$ | $M_3$ | $M_2$ | $M_1$ | $B_4$ | $B_3$ | $B_2$ | $B_1$ |
|---|---|---|---|---|---|---|---|
| $D_{12}$ | $D_8$ | $D_6$ | $D_5$ | $D_4$ | $D_3$ | $D_2$ | $D_1$ |
| $D_{13}$ | $D_9$ | $D_7$ | $D_7$ | $D_6$ | $D_7$ | $D_7$ | $D_8$ |
| $D_{14}$ | $D_{10}$ | $D_{10}$ | $D_9$ | $D_7$ | $D_9$ | $D_8$ | $D_{10}$ |
| $D_{15}$ | $D_{11}$ | $D_{11}$ | $D_{11}$ | $D_9$ | $D_{12}$ | $D_{12}$ | $D_{13}$ |
| | | $D_{14}$ | $D_{13}$ | $D_{11}$ | $D_{13}$ | $D_{15}$ | $D_{14}$ |
| | | $D_{15}$ | $D_{15}$ | | $D_{15}$ | | |

The number of syndrome bits can be generated, block 44, as the result of EXCLUSIVE ORing the check bits with the corresponding group of data bits for each data word.

Check bits are generated, block 46, by EXCLUSIVE ORing all of the data bits of each group (base group or multiple layer group), much as odd parity is normally generated, in the manner shown below.

$$C_0 = D_{12} \oplus D_{13} \oplus D_{14} \oplus D_{15}$$

$$C_1 = D_8 \oplus D_9 \oplus D_{10} \oplus D_{11}$$

$$C_2 = D_6 \oplus D_7 \oplus D_{10} \oplus D_{11} \oplus D_{14} \oplus D_{15}$$

$$C_3 = D_5 \oplus D_7 \oplus D_9 \oplus D_{11} \oplus D_{13} \oplus D_{15}$$

$$C_4 = D_4 \oplus D_6 \oplus D_7 \oplus D_9 \oplus D_{11}$$

$$C_5 = D_3 \oplus D_7 \oplus D_9 \oplus D_{12} \oplus D_{13} \oplus D_{15}$$

$$C_6 = D_2 \oplus D_7 \oplus D_8 \oplus D_{12} \oplus D_{15}$$

$$C_7 = D_1 \oplus D_8 \oplus D_{10} \oplus d_{13} \oplus D_{14}$$

The check bits shown above are appended to and stored with the data word for furture transmission.

Syndrome bits are then generated, block 48, as hereinabove mentioned, by EXCLUSIVE ORing the previously generated check bits with their corresponding data bits. For the ongoing 15-bit data word example, the syndrome bits are derived as shown below.

$$S_0 = C_0 \oplus D_{12} \oplus D_{13} \oplus D_{14} \oplus D_{15}$$

$$S_1 = C_1 \oplus D_8 \oplus D_9 \oplus D_{10} \oplus D_4$$

$$S_2 = C_2 \oplus D_6 \oplus D_7 \oplus D_{10} \oplus D_{11} \oplus D_{14} \oplus D_{15}$$

$$S_3 = C_3 \oplus D_5 \oplus D_7 \oplus D_9 \oplus D_{11} \oplus D_{13} \oplus D_{15}$$

$$S_4 = C_4 \oplus D_4 \oplus D_6 \oplus D_7 \oplus D_9 \oplus D_{11}$$

$$S_5 = C_5 \oplus D_3 \oplus D_7 \oplus D_9 \oplus D_{12} \oplus D_{13} \oplus D_{15}$$

$$S_6 = C_6 \oplus D_2 \oplus D_7 \oplus D_8 \oplus D_{12} \oplus D_{15}$$

$$S_7 = C_7 \oplus D_1 \oplus D_8 \oplus D_{10} \oplus D_{13} \oplus D_{14}$$

In order to decode the syndrome bits, block 50, an error code list must be generated. The preferred method of generating such an error code list is again, empirically, to exercise arbitrary single code errors and record the resultant syndrome codes. Then double bit error combinations should be exercised for the same purpose.

In the ongoing 15-bit data word example, a partial error code list is shown below.

| Type of Error | $S_0$ | $S_1$ | $S_2$ | $S_3$ | $S_4$ | $S_5$ | $S_6$ | $S_7$ |
|---|---|---|---|---|---|---|---|---|
| No Error | 0 | 0 | 0 | 0 | 0 | 0 | 0 | 0 |
| $D_1$ | 0 | 0 | 0 | 0 | 0 | 0 | 0 | 1 |
| $D_1$ and $D_2$ | 0 | 0 | 0 | 0 | 0 | 0 | 1 | 1 |
| $D_1$ and $D_3$ | 0 | 0 | 0 | 0 | 0 | 1 | 0 | 1 |
| $D_1$ and $D_4$ | 0 | 0 | 0 | 0 | 1 | 0 | 0 | 1 |
| $D_1$ and $D_5$ | 0 | 0 | 0 | 1 | 0 | 0 | 0 | 1 |
| $D_1$ and $D_6$ | 0 | 0 | 1 | 0 | 0 | 0 | 0 | 1 |
| $D_1$ and $D_7$ | 0 | 0 | 1 | 1 | 1 | 1 | 1 | 1 |
| $D_1$ and $D_8$ | 0 | 1 | 0 | 0 | 0 | 0 | 1 | 0 |
| $D_1$ and $D_9$ | 0 | 1 | 0 | 1 | 1 | 1 | 0 | 1 |
| . . . | . | | | | | | | |
| . . . | . | | | | | | | |
| . . . | . | | | | | | | |

Once the syndrome bit code list or pattern has been arranged, errors can be corrected, block 52.

Referring again also to FIG. 1, the indicator 18 is adapted to indicate any one of the following four conditions:

(a) No error.

(b) Single error.

(c) Double error.

(d) Multiple error.

A syndrome code of all 0's indicates no error; one or more 1's in the syndrome code indicates that at least one error has occurred during data transmission.

The list of error codes that identifies single bit errors can be used to generate a single indicative of that condition. Similarly, the list of error codes that identifies double bit errors can be used to generate a single indicative of double bit errors. Finally, the list of all remaining error codes, excluding the code of all 0's, can be used to generate a signal indicative of multiple errors.

Correction of single bit or double bit errors in a data word is accomplished merely by EXCLUSIVE ORing the list of single bit or double bit error codes with the corresponding data bits.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. A method for detecting multiple errors that occur during transfer of a data message having a plurality of data bits and for correcting up to two of said errors, the steps comprising:

(a) calculating a number of check bits associated with said data message;

(b) grouping all data bits in a data message into base groups and multiple layer groups, the sum of the number of base groups and the number of multiple layer groups of data bits being equal to said number of check bits;

(c) assigning up to two weights for each data bit;

(d) distributing data bits among said groups according to weights assigned thereto;

(e) generating a check bit for each of said groups the total number of generated check bits being equal to the number calculated in step (a);

(f) padding said data message with said total number of generated check bits to form an appended data message;

(g) generating a predetermined number of syndrome bits, said predetermined number being equal to said number of check bits; and (h) decoding said syndrome bits to identify the erroneous bits in said data message.

2. The method in accordance with claim 1 wherein the number of bits b in one of said base groups is derived from the equation:

$$b = |Log_2 (N)|$$

ps where N is the number of bits in said data message.

3. The method in accordance with claim 2 wherein the number of bits m in one of said multiple layer groups is derived from the equation:

$$m = |Log_2 (N-b+1)|.$$

4. The method in accordance with claim 1 wherein said check bit is generated by performing an EXCLUSIVE OR operation on all of the data bits of the group corresponding thereto.

5. The method in accordance with claim 4 wherein each of said syndrome bits is generated by performing an EXCLUSIVE OR operation on a check bit and all data bits of the group corresponding thereto.

* * * * *